United States Patent
Watanabe et al.

(10) Patent No.: US 11,121,000 B2
(45) Date of Patent: Sep. 14, 2021

(54) ETCHING METHOD AND SUBSTRATE PROCESSING APPARATUS

(71) Applicant: Tokyo Electron Limited, Tokyo (JP)

(72) Inventors: Seiichi Watanabe, Miyagi (JP); Hiroki Yamada, Miyagi (JP); Manabu Sato, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/983,229

(22) Filed: Aug. 3, 2020

(65) Prior Publication Data

US 2021/0043461 A1  Feb. 11, 2021

(30) Foreign Application Priority Data

Aug. 9, 2019  (JP) .............................. JP2019-148132

(51) Int. Cl.
*H01L 21/311* (2006.01)
*H01L 21/3213* (2006.01)
(52) U.S. Cl.
CPC .. *H01L 21/31116* (2013.01); *H01L 21/31144* (2013.01); *H01L 21/32139* (2013.01)

(58) Field of Classification Search
None
See application file for complete search history.

(56) References Cited

U.S. PATENT DOCUMENTS

2016/0293440 A1\* 10/2016 Nagatomo ........ H01L 27/11573

FOREIGN PATENT DOCUMENTS

JP  2019-009259  1/2019

\* cited by examiner

*Primary Examiner* — Roberts P Culbert
(74) *Attorney, Agent, or Firm* — IPUSA, PLLC

(57) ABSTRACT

There is provision of a method for etching a substrate above which a first underlying film, a second underlying film positioned deeper than the first underlying film, a silicon oxide film formed on the first and second underlying films, and a mask on the silicon oxide film are provided. In the mask, first and second openings are formed above the first and second underlying films respectively. After the first underlying film is exposed by etching the silicon oxide film using a first gas, the silicon oxide film is etched by using a second gas while depositing deposits on the first underlying film, and the silicon oxide film is etched by using a third gas while removing the deposits on the first underlying film. The etching using the second gas and the etching using the third gas are repeated multiple times.

19 Claims, 11 Drawing Sheets

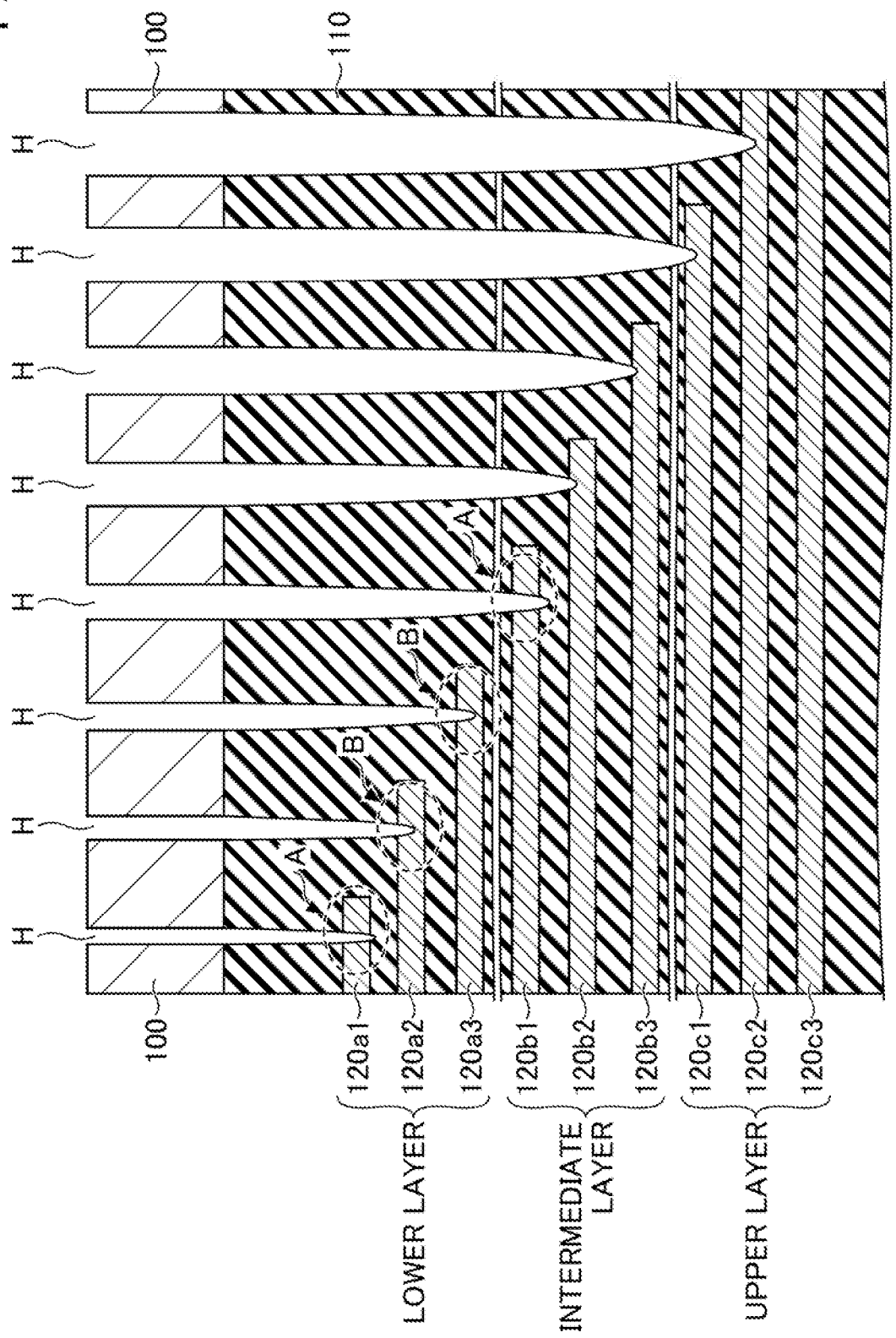

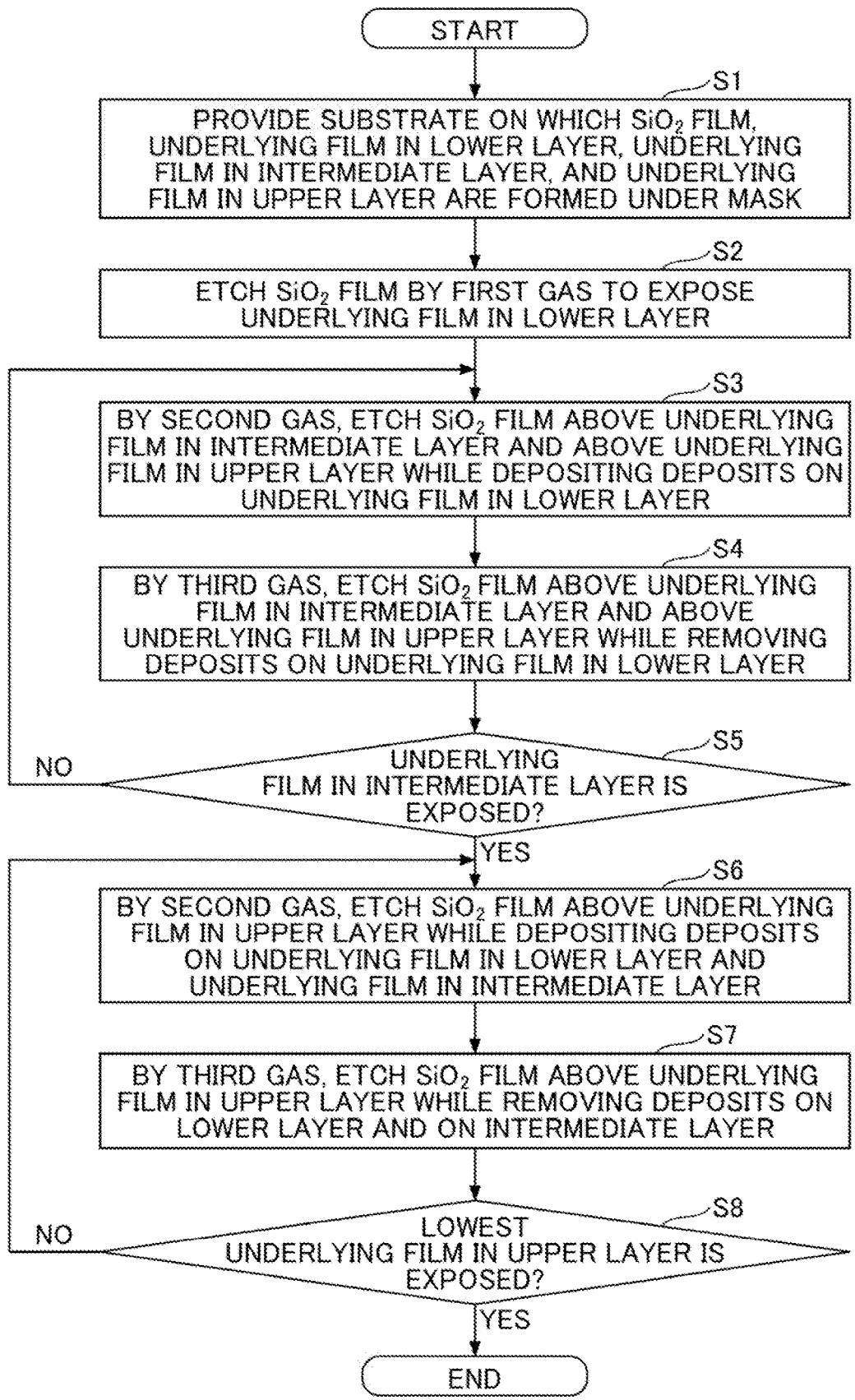

FIG.4B
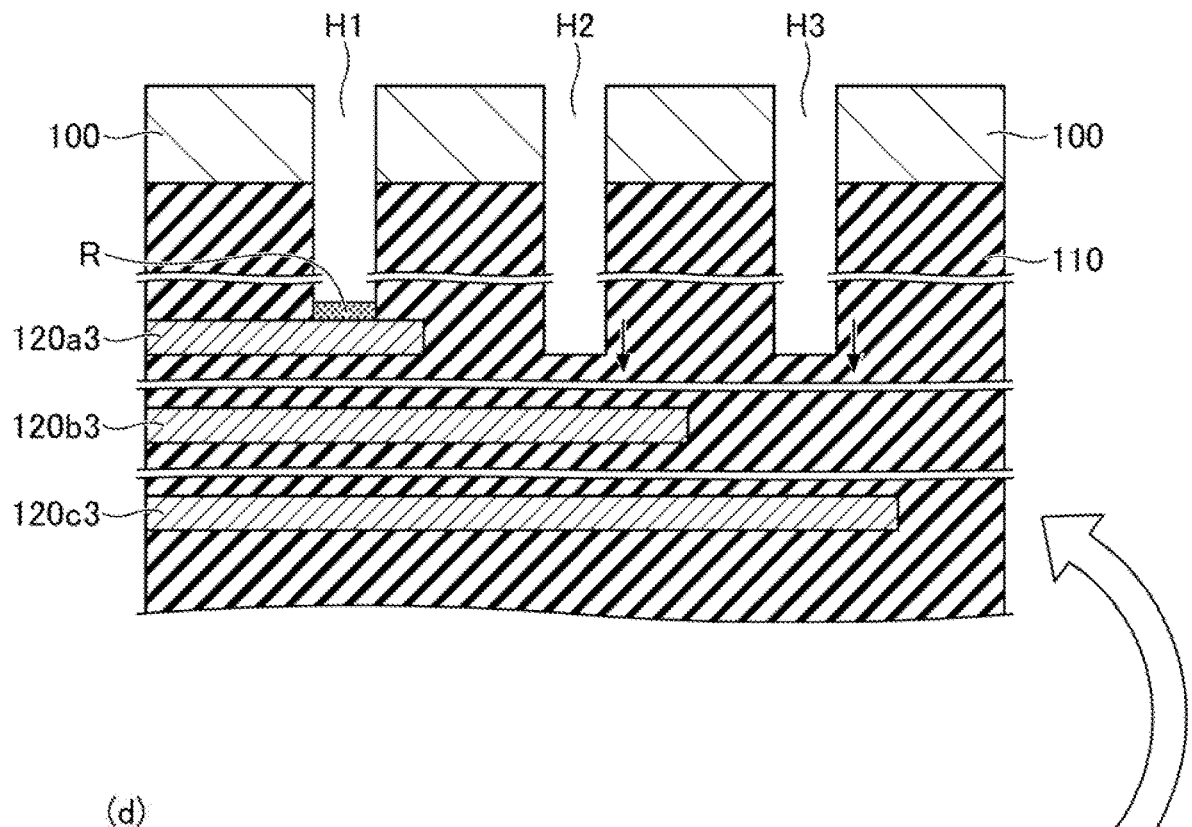
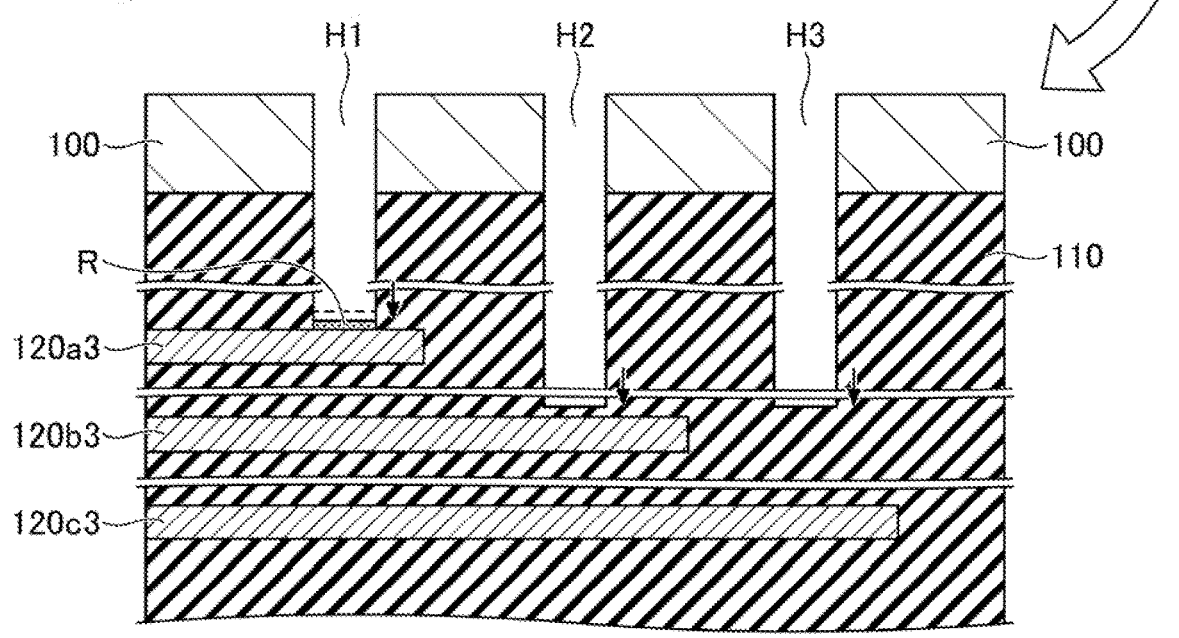

FIG.4C
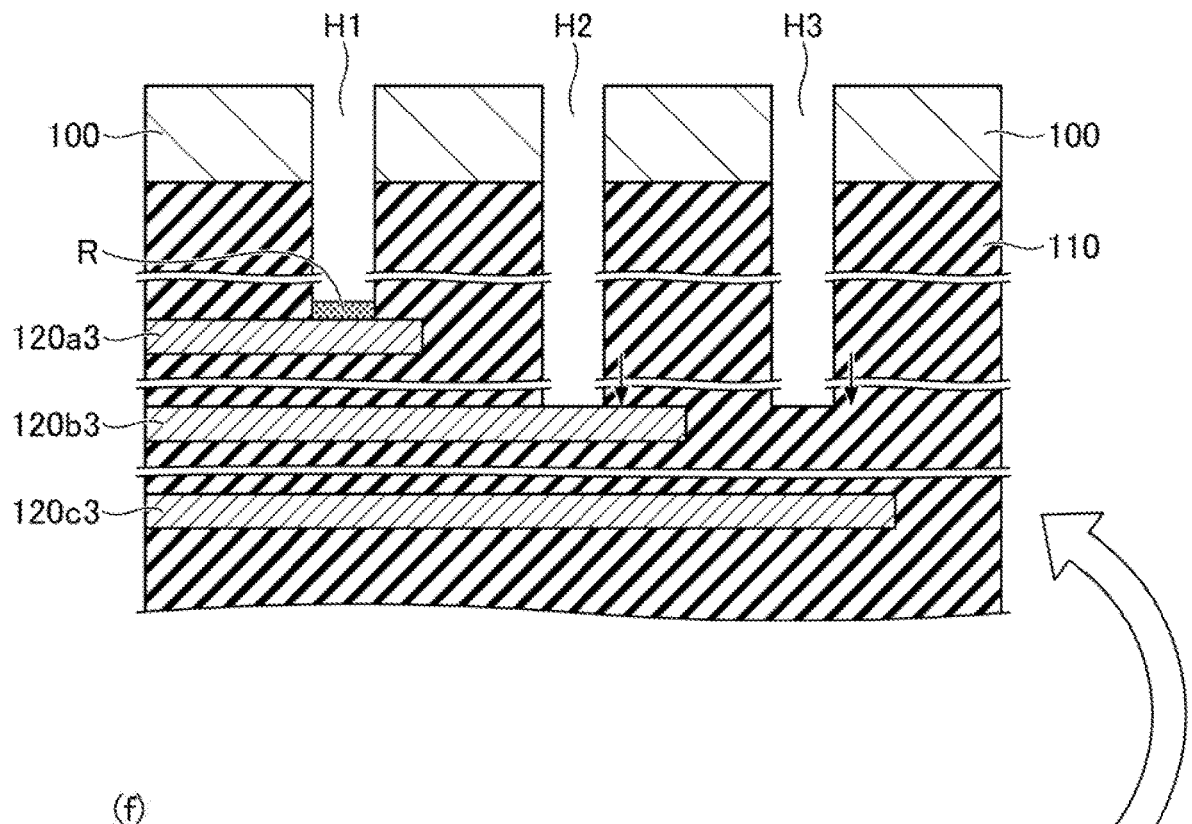
(e)
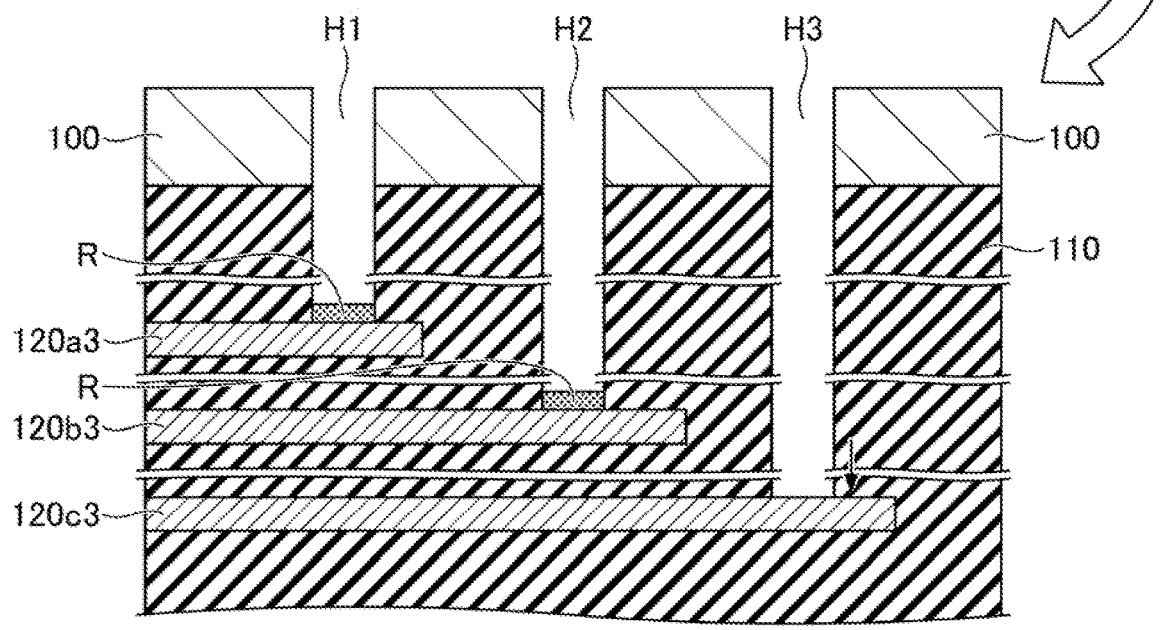
(f)

FIG.8

| Condition | Mode | C$_4$F$_6$ | C$_3$F$_8$ | CO | O$_2$ | C amount | F amount | O amount | C/O |
|---|---|---|---|---|---|---|---|---|---|
| C1 | Etch | 50 | 0 | 425 | 54 | 625 | 300 | 533 | 1.17 |
| C2 | Etch | 30 | 20 | 425 | 24 | 605 | 340 | 473 | 1.28 |
| C3 | Depo | 30 | 20 | 425 | 21 | 605 | 340 | 467 | 1.30 |
| C4 | Depo | 30 | 30 | 425 | 21 | 635 | 420 | 467 | 1.36 |
| C5 | Etch | 18 | 30 | 425 | 18 | 587 | 348 | 461 | 1.27 |
| C6 | Etch | 20 | 30 | 425 | 18 | 595 | 360 | 461 | 1.29 |
| C7 | Depo | 22 | 30 | 425 | 18 | 603 | 372 | 461 | 1.31 |

ETCHING METHOD AND SUBSTRATE PROCESSING APPARATUS

CROSS-REFERENCE TO RELATED APPLICATIONS

This patent application is based upon and claims priority to Japanese Patent Application No. 2019-148132 filed on Aug. 9, 2019, the entire contents of which are incorporated herein by reference.

TECHNICAL FIELD

The present disclosure relates to an etching method and a substrate processing apparatus.

BACKGROUND

For example, Patent Document 1 describes a technique for preparing a substrate having multiple underlying films positioned at different heights and having a target film formed on the multiple underlying films, and for etching holes of different depths to the target film using a mask having multiple openings located above the respective underlying films.

RELATED ART DOCUMENT

Patent Document

[Patent Document 1] Japanese Laid-open Patent Application Publication No. 2019-009259

SUMMARY

The present disclosure provides an etching method and substrate processing apparatus for etching silicon oxide films on each underlying film at different depths while suppressing damage to multiple underlying films located at different heights.

According to one aspect of the present disclosure, there is provision of a method of etching a substrate above which a first underlying film, a second underlying film formed at a deeper location than the first underlying film, a silicon oxide film formed on the first underlying film and the second underlying film, and a mask formed on the silicon oxide film are provided. The mask has a first opening formed above the first underlying film and a second opening formed above the second underlying film. In the method, first, the silicon oxide film above the first underlying film and the second underlying film is etched by using a first gas, to expose the first underlying film. Next, the silicon oxide film above the second underlying film is etched by using a second gas while depositing deposits on the first underlying film, and the silicon oxide film above the second underlying film is further etched by using a third gas while removing the deposits on the first underlying film. The etching using the second gas and the etching using the third gas are repeated multiple times.

BRIEF DESCRIPTION OF THE DRAWINGS

FIG. 2 is a diagram illustrating a film structure and conventional problems;

FIG. 3 is a flow chart illustrating an etching method according to the embodiment;

FIGS. 4A to 4C are diagrams each illustrating a cross-section of a film on a substrate W at each step of the etching method according to the embodiment;

FIG. 8 is a diagram illustrating a relationship between an etching mode, a gas species that can be used in the etching method in accordance with the embodiment, and a flow rate of the gas.

DETAILED DESCRIPTION OF EMBODIMENTS

Figure 1:
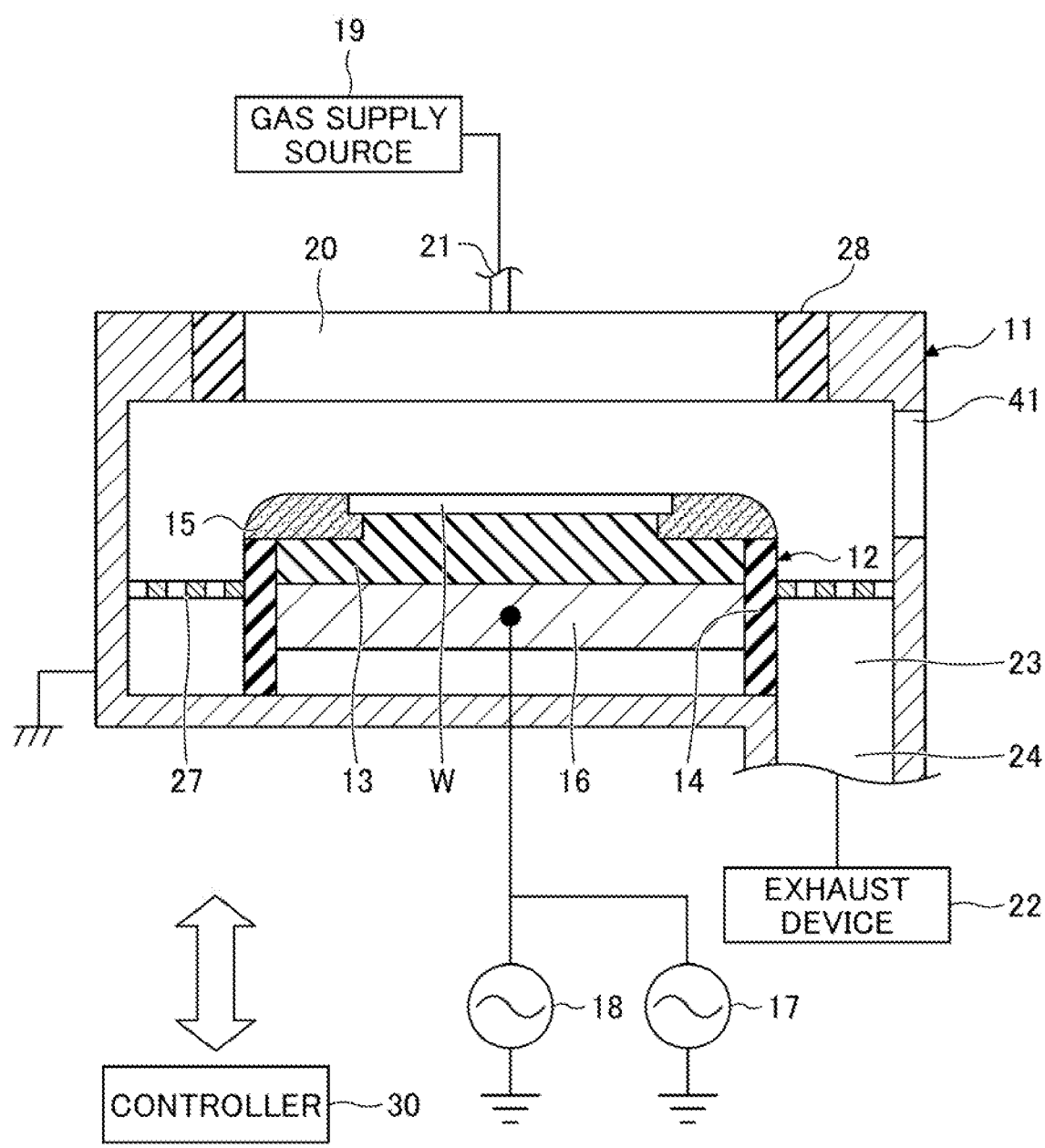
FIG. 1 is a cross-sectional view illustrating an example of a substrate processing apparatus according to an embodiment.

Hereinafter, embodiments for carrying out the present disclosure will be described with reference to the drawings. In each drawing, the same components are indicated by the same reference numerals, and redundant descriptions may be omitted.

Substrate Processing Apparatus

The substrate processing apparatus 10 according to an embodiment will be described with reference to FIG. 1. FIG. 1 is a cross-sectional diagram illustrating an example of the substrate processing apparatus 10 according to the present embodiment.

The substrate processing apparatus 10 includes a processing vessel 11 and a stage 12 disposed therein. The processing vessel 11 is grounded. The stage 12 includes an electrostatic chuck 13 and a base 16. The base 16 supports the electrostatic chuck 13. The stage 12 is disposed at the bottom of the processing vessel 11 via a support portion 14 of the insulating member.

The base 16 is formed of metal such as aluminum. The electrostatic chuck 13 is formed of a dielectric such as alumina ($Al_2O_3$). The electrostatic chuck 13 is generally circular in a plan view. The electrostatic chuck 13 holds a substrate W by electrostatic attractive force generated by applying DC voltage to an electrode (not illustrated).

On the electrostatic chuck 13, a substrate W is placed at the center of the electrostatic chuck 13, and an annular edge ring 15 (also referred to as a focus ring) surrounding the substrate W is placed at the outer circumference of the electrostatic chuck 13.

An annular exhaust path 23 is formed between the inner side wall of the processing vessel 11 and the outer side wall of the stage 12, and the exhaust path 23 is connected to an exhaust device 22 via an exhaust port 24. The exhaust device 22 is configured by a vacuum pump. The exhaust device 22 evacuates gas in the processing vessel 11 to reduce a process space in the processing vessel 11 to a predetermined quality of vacuum. The exhaust path 23 is provided with a baffle plate 27 which separates the processing space from an exhaust space, and which controls gas flow.

The stage 12 is connected to a first radio frequency power supply 17 and a second radio frequency power supply 18. The first radio frequency power supply 17 applies radio frequency power HF, e.g., radio frequency power of 40 MHz for plasma generation, to the stage 12. The second radio frequency power supply 18 applies radio frequency power LF, e.g., radio frequency power of 400 kHz for drawing ions, to the stage 12.

At an opening of a ceiling of the processing vessel 11, a showerhead 20 is provided via a ring-shaped insulating member 28. A gas supply source 19 supplies gas according to a process condition. Gas enters the showerhead 20 via a gas line 21, and is introduced into the processing vessel 11 like a shower. The radio frequency power HF is applied capacitively between the stage 12 and the showerhead 20, and a plasma is generated from the gas by the radio frequency power HF.

The substrate processing apparatus 10 includes a controller 30. The controller 30 controls an entirety of the substrate processing apparatus 10.

When processing is performed in the substrate processing apparatus 10 according to the above described configuration, a substrate W is first loaded into the processing vessel 11 from a gate valve (not illustrated) through a loading port 41, while the substrate W is held by the conveying arm. The substrate W is placed on an electrostatic chuck 13. The gate valve is closed after the substrate W is loaded.

The pressure in the processing vessel 11 is reduced to a preset set value by the exhaust device 22, and the interior of the processing vessel 11 is maintained to be in a vacuum state. A predetermined gas is introduced from the showerhead 20 into the processing vessel 11, and the radio frequency power HF and the radio frequency power LF are applied to the stage 12 to produce a plasma. By effect of the plasma, a film on the substrate W is etched. After the etching is complete, the substrate W is held on the transport arm, and is unloaded to an outside of the processing vessel 11.

Film Structure

Next, the film structure on the substrate W placed on the stage 12 will be described with reference to FIG. 2. FIG. 2 is a diagram illustrating the film structure on the substrate W and conventional problems.

In a manufacturing process of a 3D-NAND device or the like, underlying films 120a1, 120a2, 120a3 . . . of a lower layer, underlying films 120b1, 120b2, 120b3 . . . of an intermediate layer, and underlying films 120c1, 120c2, 120c3 . . . of an upper layer are disposed at different heights (depth) in a silicon oxide film 110 under a mask. The underlying films in the lower layer, the intermediate layer, and the upper layer are collectively referred to as an underlying film 120. The underlying film 120 may be formed of tungsten or silicon. An amorphous carbon film is used as the mask.

In an etching process, multiple holes H of different depths are etched simultaneously on the silicon oxide film 110, until the underlying films in the lower, intermediate, and upper layers are exposed. FIG. 2 illustrates a case in which three underlying films are present in each of the lower layer, the intermediate layer, and the upper layer, and illustration of other layers are omitted. However, the number of underlying films of the lower layer, the intermediate layer, and the upper layer may be one or more, and the number of underlying films in each of the layers may differ.

Regarding the holes H on the underlying films in the lower and intermediate layers, even after the underlying films under the holes H are exposed, fluorocarbon-based (CF-based) radicals and ions enter the holes H, until holes H on an underlying film in the upper layer has been etched to expose the underlying film in the upper layer. Accordingly, there is a problem in which the underlying films in the lower and intermediate layers exposed at the bottom of the hole H are damaged.

Especially in the lower layer and the intermediate layer, an irradiation rate of ions in a plasma entering the hole H tends to be higher than that in the upper layer. In addition, as the depth of a hole etched on the underlying film in the intermediate layer is deeper than that on the underlying film in the lower layer, it is difficult to deposit by-products at the bottom of the hole. Therefore, underlying films 120a1 and 120b1 are penetrated (punch through) as illustrated in a region indicated by arrows A in FIG. 2, or underlying films 120a2 and 120a3 are eroded as illustrated in a region indicated by arrows B in FIG. 2, which are problems.

Further, in recent years, the number of underlying films has increased, and the thickness of the silicon oxide film has increased. In addition, thinning of the underlying film is progressing. Therefore, it is required to simultaneously form holes of different depths in the silicon oxide film while improving selectivity between the silicon oxide film and the underlying film, and while avoiding damage to the underlying film.

That is, in etching the film structure of FIG. 2, it is important to eliminate trade-off between reduction of damage to the lower and intermediate layers and promotion of etching above the upper layer.

Accordingly, in the following, the present disclosure proposes an etching method according to one embodiment in which a silicon oxide film on each of the underlying films can be etched at different depths while preventing damage to the multiple underlying films located at different heights.

Etching Method

Figure 4A:
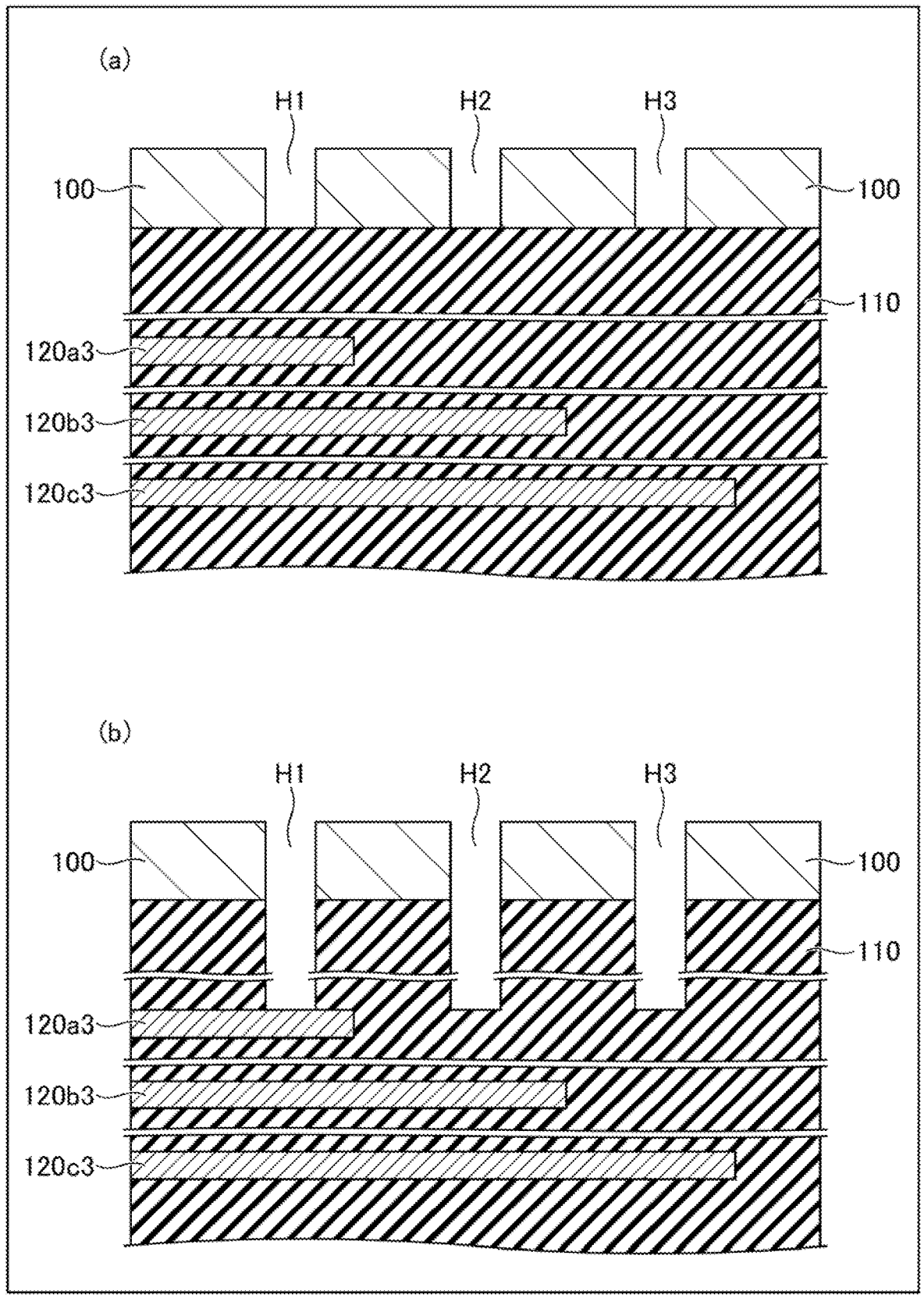

The etching method according to the embodiment will be described with reference to FIGS. 3 and 4A to 4C. FIG. 3 is a flow chart illustrating the etching method according to the embodiment. FIGS. 4A to 4C are diagrams each illustrating a cross-section of a film on a substrate W at each step of the etching method according to the embodiment. The etching method according to the embodiment is controlled by the controller 30.

A diagram (a) of FIG. 4A illustrates an initial state of the film on the substrate W. An underlying film in a lower layer is formed on the substrate W (only the underlying film 120a3 is illustrated). In addition, an underlying film in an intermediate layer is formed (only the underlying film 120b3 is illustrated) at a position deeper than the underlying film in the lower layer. Further, an underlying film in an upper layer is formed (only the underlying film 120c3 is illustrated) at a position deeper than the underlying film in the intermediate layer.

In FIGS. 4A to 4C, the underlying film 120a3 in the lower layer, the underlying film 120b3 in the intermediate layer, and the underlying film 120c3 in the upper layer are each illustrated as the lowest underlying film in the respective layers, and the following description will be made based on this premise. However, the present invention is not limited to the premise. The underlying film 120a3 may be one of any underlying films provided in the lower layer, the underlying film 120b3 may be one of any underlying films provided in the intermediate layer, and the underlying film 120c3 may be one of any underlying films provided in the upper layer. In the lower, intermediate, and upper layers, each underlying film extends horizontally longer than an underlying film located just above said each underlying film. The underlying film 120a3 is an example of a first underlying film, the underlying film 120*b*3 is an example of a second underlying film, and the underlying film 120*c*3 is an example of a third underlying film.

The mask 100 includes a first opening (hole H1) formed above the underlying film 120*a*3, a second opening (hole H2) formed above the underlying film 120*b*3, and a third opening (hole H3) formed above the underlying film 120*c*3. In the present embodiment, each of the holes H1, H2, and H3 has a circular cross-section, but is not limited thereto. The holes H1, H2, and H3 may be of a line shape.

In the etching method according to the embodiment, an example is described, in which the underlying film 120*c*3 in the upper layer is at the lowest position among the underlying films 120, but not limited thereto. A total number of underlying films in the lower, intermediate, and upper layers may be, for example, from 10 to 100, or may be more than 100.

When the process of FIG. 3 is started, the substrate W, on which the silicon oxide film 110, the underlying film in the lower layer, the underlying film in the intermediate layer, and the underlying film in the upper layer are formed under the mask 100, is provided (step S1). The term "providing the substrate W" means that the substrate W is loaded into the substrate processing apparatus 10 and is placed on the stage 12.

Next, a first gas is formed into a plasma to etch the silicon oxide film 110, and thereby expose the underlying film 120*a*3 In the lower layer (step S2). As a result, as illustrated in a diagram (b) of FIG. 4A, the silicon oxide film 110 is etched until the underlying film 120*a*3 in the lower layer is exposed, and the hole H1 is formed as a contact hole. At this time, the holes H2 and H3 are also formed simultaneously with the hole H1. However, because the underlying film 120*b*3 and the underlying film 120*c*3 are provided deeper than the underlying film 120*a*3, the holes H2 and H3 do not reach the underlying film 120*b*3 and the underlying film 120*c*3, respectively. Step S2 is an example of "a first step of etching the silicon oxide film through the first opening using the first gas, to expose the first underlying film". Note that the "underlying film in the lower layer" in step S2 is not required to be the lowest underlying film in the lower layer, but may be any one of the underlying films in the lower layer.

Next, in step S3 of FIG. 3, by forming a second gas into a plasma, the silicon oxide film 110 above the underlying film 120*b*3 in the intermediate layer and above the underlying film 120*c*3 in the upper layer is etched, while depositing deposits on the underlying film 120*a*3 in the lower layer (step S3). Step S3 is an example of "a second step of etching the silicon oxide film above the second underlying film through the second opening, while depositing deposits on the first underlying film using the second gas". As a result, as illustrated in a diagram (c) of FIG. 4B, the hole H2 above the underlying film 120*b*3 and the hole H3 above the underlying film 120*c*3 can be etched deeper while depositing by-products R on the underlying film 120*a*3 at the bottom of the hole H1.

Next, in step S4 of FIG. 3, by forming a third gas into a plasma, the silicon oxide film 310 above the underlying film 120*b*3 in the intermediate layer and the silicon oxide film 110 above the underlying film 120*c*3 in the upper layer are further etched, while removing at least a portion of the by-products R on the underlying film 120*a*3 in the lower layer (step S4). Step S4 is an example of "a third step of etching the silicon oxide film above the second underlying film through the second opening by using the third gas, while removing deposits deposited on the first underlying film". As a result, the hole H2 above the underlying film 120*b*3 and the hole H3 above the underlying film 120*c*3 can be etched deeper while removing a portion of the by-products R on the underlying film 120*a*3, as illustrated in a diagram (d) of FIG. 4B.

Next, in step S5 of FIG. 3, it is determined whether or not the underlying film 120*b*3 in the intermediate layer is exposed (step S5). If the underlying film 120*b*3 is not exposed, the process returns to step S3, and steps S3 to S5 are repeated. As a result, the second step and the third step are repeated multiple times, and the underlying film 120*b*3 is exposed as illustrated in a diagram (e) of FIG. 4C. In this case, in step S5 of FIG. 3, if it is determined that the underlying film 120*b*3 in the intermediate layer is exposed, the process proceeds to step S6. The "underlying film in the intermediate layer" in step S5 needs not necessarily be the lowest underlying film layer in the intermediate layer, but may be any underlying film in the intermediate layer.

In step S6, a second gas is formed into a plasma to etch the silicon oxide film 110 above the underlying film 120*c*3 in the upper layer, while depositing deposits on the underlying film 120*a*3 in the lower layer and the underlying film 120*b*3 in the intermediate layer. Step S6 is an example of "a second step".

Next, in step S7 of FIG. 3, a third gas is formed into a plasma to further etch the silicon oxide film 110 above the underlying film 120*c*3 in the upper layer, in parallel with removing at least a portion of the by-products R on the underlying film 120*a*3 in the lower layer and on the underlying film 120*b*3 in the intermediate layer (step S7). Step S7 is an example of "a third step". As a result of performing step S6 and step S7, as illustrated in a diagram (f) of FIG. 4C, the hole H3 above the underlying film 120*c*3 in the upper layer is etched deeper, while the by-products R are deposited on the underlying films 120*a*3 and 120*b*3 at the bottom of the respective holes H1 and H2.

Next, in step S8 of FIG. 3, it is determined whether the lowest underlying film 120*c*3 in the upper layer is exposed (step S8). If it is determined that the lowest underlying film 120*c*3 in the upper layer is not exposed, the process returns to step S6, and steps S6 through S8 are performed again. In a case in which the underlying film 120*c*3 is exposed as illustrated in the diagram (f) of FIG. 4C, the present process is terminated.

In the above-described etching method according to the present embodiment, deposition-mode etching, in which deposits tend to be deposited at the bottom of a hole, is performed in the second step, and removal-mode etching, in which deposits are not easily deposited at the bottom of a hole, is performed in the third step. In addition, the second step and the third step are repeated in this order.

A step of repeating the set of the second step and the third step may be performed after the underlying film 120*a*3 is exposed and before the underlying film 120*b*3 is exposed, as illustrated in the diagram (c) or (d) of FIG. 4B. The step of repeating the set of the second step and the third step may be performed after the underlying film 120*b*3 is exposed and before the underlying film 120*c*3 is exposed, as illustrated in the diagram (e) or (f) of FIG. 4C.

Accordingly, in the lower layer and the intermediate layer, damage to the underlying film caused by ions can be reduced by the by-products R, and ions can be positively injected into a hole in the upper layer to promote etching. That is, by repeating the set of the second step and the third step, the silicon oxide film 110 on each of the underlying films 120 can be etched to a different depth without stopping etching of the silicon oxide film 110 on each of the underlying films 120, while preventing damage to the multiple underlying films 120 positioned at different heights.

Deposition Etching/Removal Etching

Next, process conditions in the first step to the third step will be described below, and the reason why the underlying film in the upper layer can be etched while actively depositing by-products R of CF polymer on the underlying film in the lower and intermediate layers in the second step will be described.

First Step

An example of a process condition in the first step is illustrated below.

Process Condition in First Step

Pressure: 15 mTorr to 30 mTorr (2.0 Pa to 4.0 Pa)
HF: ON (4000 W to 5500W)
LF: ON (6000 W to 8750W)
First gas: $C_4F_6$, $O_2$ However, the first gas is not limited to a mixture of $C_4F_6$ and $O_2$. Any gas may be used as the first gas, so long as the gas can etch a silicon oxide film and obtain a selectivity with respect to an underlying film. For example, the first gas may contain at least one of CO, $CO_2$, and $N_2$ in addition to $C_4F_6$ and $O_2$. Ar may also be contained. Some or all of $C_4F_6$ may be replaced by $C_4F_8$. The first gas may also be the same as the third gas.

Second Step

An example of a process condition in the second step is illustrated below.

Process Condition in Second Step

Pressure: 15 mTorr to 30 mTorr
HF: ON (4000 W to 5500 W)
LF: ON (6000 W to 8750 W)
Second gas: $C_3F_8$, $O_2$ However, the second gas is not limited to a mixture of $C_3F_8$ and $O_2$. The second gas may contain a second CF-containing gas and oxygen gas, and any gas may be used as the second gas as long as the gas can etch a silicon oxide film and tends to deposit at the bottom of a hole. The second CF-containing gas is a gas different from a first CF-containing gas to be described below, which is contained in the third gas, and a C/F ratio of the second CF-containing gas may be lower that of the first CF-containing gas. The second CF-containing gas is, for example, $C_3F_8$.

The second gas may contain a gas other than the second CF-containing gas and the oxygen gas. For example, the second gas may contain at least one of $C_4F_6$, $C_4F_8$, CO, $CO_2$, and $N_2$, in addition to $C_3F_8$ and $O_2$. Additionally, Ar may be contained.

Third Step

An example of a process condition in the third step is illustrated below.

Process Condition in Third Step

Pressure: 15 mTorr to 30 mTorr
HF: ON (4000 W to 5500 W)
LF: ON (6000 W to 8750 W)
Third gas: $C_4F_6$, $O_2$ However, the third gas is not limited to a mixture of $C_4F_6$ gas and $O_2$ gas. The third gas may contain the first CF-containing gas and oxygen gas, and any gas may be used as the third gas as long as the gas can etch a silicon oxide film and is not easily deposit at the bottom of a hole. The first CF-containing gas may be a gas having a higher C/F ratio than the second CF-containing gas. The first CF-containing gas is, for example, $C_4F_6$ gas, and may be $C_4F_8$ gas. The third gas may also include a gas other than the first CF-containing gas and oxygen gas. For example, the third gas may include at least one of $C_3F_8$, $C_4F_8$, CO, $CO_2$, and $N_2$, in addition to $C_4F_6$ and $O_2$. Additionally, Ar may be included.

Effects of the gas in each process will be described. In the first gas used in the first step, $C_4F_6$ gas contributes primarily to etching, and $O_2$ gas contributes primarily to control of an amount of by-products R of polymers that are generated by the etching of the silicon oxide film 110. In other words, by $O_2$ gas, necking can be suppressed.

Figure 5:
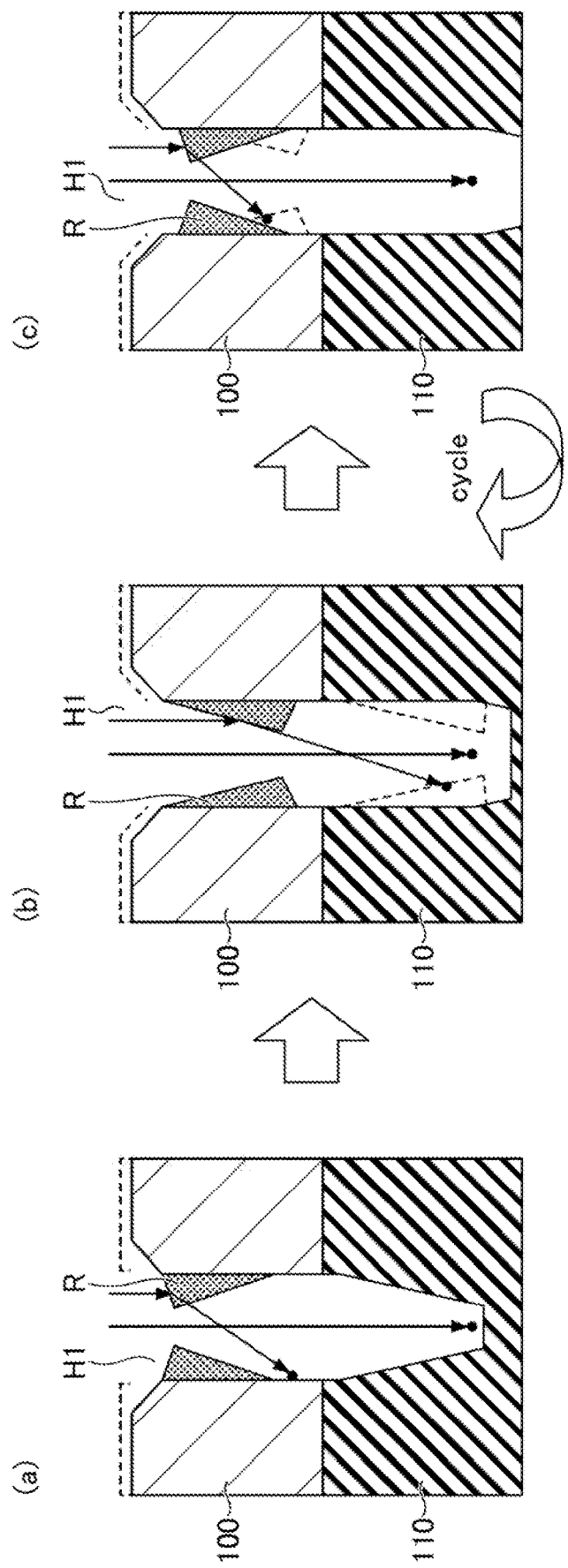
FIG. 5 is a set of diagrams illustrating states of a hole in each step in the etching method according to the embodiment.

FIG. 5 is a diagram illustrating states in the hole H1 in each of the steps in the etching method according to the present embodiment. In the first step, as illustrated in a diagram (a) of FIG. 5, by using the first gas, etching of the hole H1 is promoted by radicals and ions of $C_4F_6$ in the plasma, and necking is suppressed by the by-products R attached to the opening of the mask 100.

If the first gas contains CO, $CO_2$, or $N_2$ gas in addition to $C_4F_6$ gas and $O_2$ gas, CO gas or $CO_2$ gas is used as a dilution gas to increase the selectivity of the silicon oxide film 110 with respect to the underlying film of tungsten. $N_2$ gas contributes to control of an amount of by-products of polymers, and is used to suppress necking. In addition, if Ar gas is contained, Ar gas is used as a dilution gas to increase the selectivity with respect to the underlying film.

On the other hand, by using the first gas, by-products R are prone to attach to the opening of the hole H1 or to the top of the mask 100. Accordingly, in the etching method according to the present embodiment, after etching by the first gas is performed to a certain extent in the first step, etching by the second gas is performed in the second step, with respect to the second gas used in the second step, $C_3F_8$ gas primarily contributes to etching, and $O_2$ gas primarily contributes to control of an amount of by-products R of polymers. If the second gas contains CO gas, $CO_2$ gas, $N_2$ gas, or $C_4F_6$ gas in addition to $C_3F_8$ gas and $O_2$ gas, functions of CO gas, $CO_2$ gas, $N_2$ gas, and $C_4F_6$ gas are the same as the functions of these gases contained in the first gas, and thus the description of the functions will be omitted here.

$C_3F_8$ gas is of higher dissociation than $C_4F_8$, and has a lower adsorption coefficient than $C_4F_6$ gas at the same temperature. For example, adhesion of radicals of a CF-based gas to a film to be etched normally depends on the number of C relative to the number of F in a molecule of a radical (i.e., C/F ratio), and the higher the C/F ratio, the higher the adhesion of the CF-based gas to the film to be etched. Accordingly, in the second step, in accordance with an etching condition (e.g., temperature or residence time), $C_3F_8$ gas is selected, which is of higher dissociation than $C_4F_6$, gas and has a lower adsorption coefficient than $C_4F_6$ gas at the same temperature.

Thus, in a case in which $C_4F_6$ gas or $C_3F_8$ gas is used as the CF-based gases, at a normal etching temperature, radicals of $C_4F_6$ are partially dissociated to $CF_x$, but exist primarily as $C_4F_6$ radicals. In contrast, radicals of $C_3F_8$ are largely dissociated at a normal etching temperature, and exist primarily as $C_2F_4$ radicals.

Therefore, in the first step which is an early step of plasma etching, $C_4F_6$ with high adhesion is used as the first gas to obtain a selectivity to the underlying film 120, and in the second step following the first step, $C_3F_8$ with low adhesion is used as the second gas.

Accordingly, in the second step, as illustrated in a diagram (b) of FIG. 5, by-products R do not easily attach to the opening or the top of the mask 100, and can easily reach the bottom of the hole or a side portion near the bottom of the hole. In addition, because $C_3F_8$ gas is a gas with a lower ratio of C to F than $C_4F_6$, an amount of by-products R generated by $C_3F_8$ gas is lower than that, generated when $C_4F_6$ gas is used. Accordingly, by-products R are easily deposited from the bottom of the hole in a bottom-up manner. As a result, as illustrated in the diagram (c) of FIG. 4B, the by-products R can be deposited on the underlying film 120$a$3 at the bottom of the hole H1. At the same time, in the second step, the hole H2 above the underlying film 120$b$3 and the hole H3 above the underlying film 120$c$3 can be etched deeper. The reason will be described in the following.

In the holes H2 and H3 illustrated in the diagram (c) of FIG. 4B, the silicon oxide film 110 is etched. Thus, the by-products R produced during etching include an oxygen component which is contained in the etched silicon oxide film 110. Therefore, even when $C_3F_8$ gas is dissociated and a C component enters the holes H2 and H3, C and O react to form CO and volatilize.

On the other hand, in the hole H1 illustrated in the diagram (c) of FIG. 4B, etching of the silicon oxide film 110 is not performed in the second step because the etching has already been completed to a depth of the underlying film 120$a$3 of tungsten. Thus, at the bottom of the hole H1, no O component is contained in the by-products R. Therefore, if the $C_3F_8$ gas is dissociated and a C component enters the hole H1, reaction between C and O is not promoted at the bottom of the hole H1, and C is not consumed at the bottom of the hole H1. As a result, C is consumed at the bottom of the holes H2 and H3, and the amount of C decreases. However, C is not consumed at the bottom of the hole H1, and the amount of C increases. As a result, as illustrated in the diagram (c) of FIG. 4B, the by-products R of polymers are deposited at the bottom of the hole H1, but the by-products R are not deposited at the bottom of the holes H2 and H3, thereby facilitating etching.

As described above, in the etching method according to the present embodiment, by using $C_4F_6$ gas contained in the first gas at the first step which is an early step of etching, etching of the bottom of the hole by $C_4F_6$ radicals and ions is promoted.

Thereafter, in the second step, etching is performed using the $C_3F_8$ gas contained in the second gas. Thus, with respect to a hole in which the underlying film 120 is exposed, because by-products R are deposited on the bottom of the hole, damage to the underlying film 120 in which the bottom of the hole is shaved is less likely to occur. Also, with respect to holes in which the underlying film 120 is not exposed, etching can continue.

In the etching method according to the present embodiment, the third step is performed after the second step. The second step and the third step are performed for the predetermined number of times. The predetermined number of times is preferably two or more.

In the third step, etching is performed using $C_4F_6$ gas and $O_2$ gas contained in the third gas. Thus, in the third step, as illustrated in a diagram (c) of FIG. 5, while removing by-products R at the bottom of the hole H1 by using radicals of $C_4F_6$ and ions in the plasma, occurrence of necking caused by by-products R that adhere to the opening of the mask 100 can be suppressed. Also, as illustrated in the diagram (d) of FIG. 4B, etching of the holes H2 and H3 can be promoted.

Here, before all of the by-products R at the bottom of the hole H1 are removed in the third step, a second step is performed again. The second step and the third step are repeated for the predetermined number of times, as illustrated in the diagrams (c) and (d) of FIG. 4B. This removes all of the by-products R at the bottom of the hole H1, and can effectively prevent the underlying film 120 from being damaged.

Figure 6:
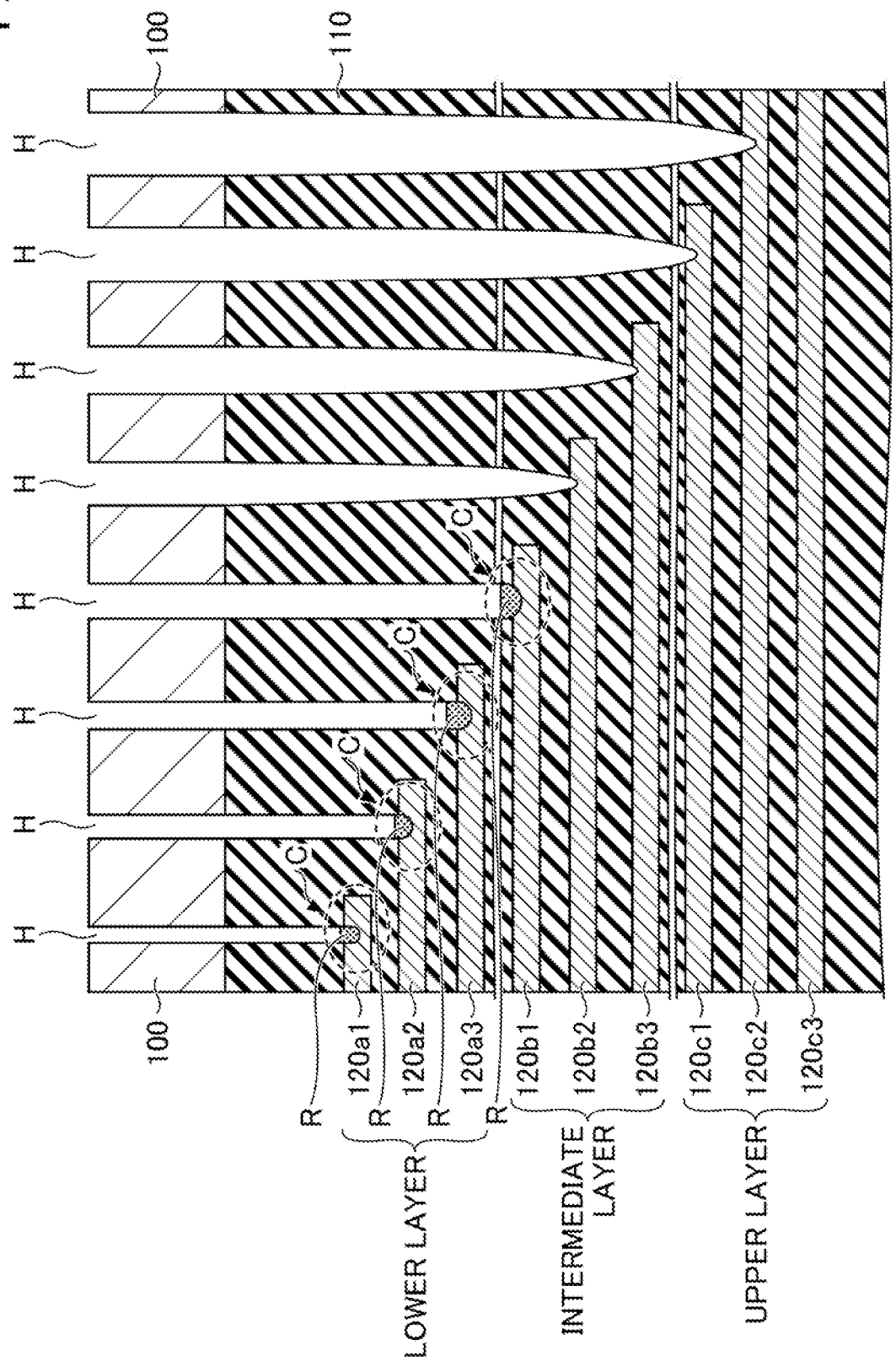
FIG. 6 is a diagram illustrating an effect of the etching method according to the embodiment.

As described above, according to the etching method in the present embodiment, etching of the silicon oxide film 110 of the upper layer or the intermediate layer with different depths can be performed while suppressing damage to the underlying film in the lower layer or the intermediate layer (see regions in FIG. 6 indicated by arrows C), as illustrated in FIG. 6.

It is preferable that processing time of the second step is shorter than processing time of the third step. Since the etching having a deposition property is performed in the second step as compared to the third step, the by-products R easily adhere not only to the bottom of the hole but also to the side surface of the hole and the opening of the mask 100. Therefore, by making the processing time of the second step shorter than the processing time of the third step, excess by-products R do not adhere, and occurrence of etch stop can be avoided. For example, the processing time of the third step may be approximately 10 times the processing time of the second step.

Experimental Result

Figure 7:
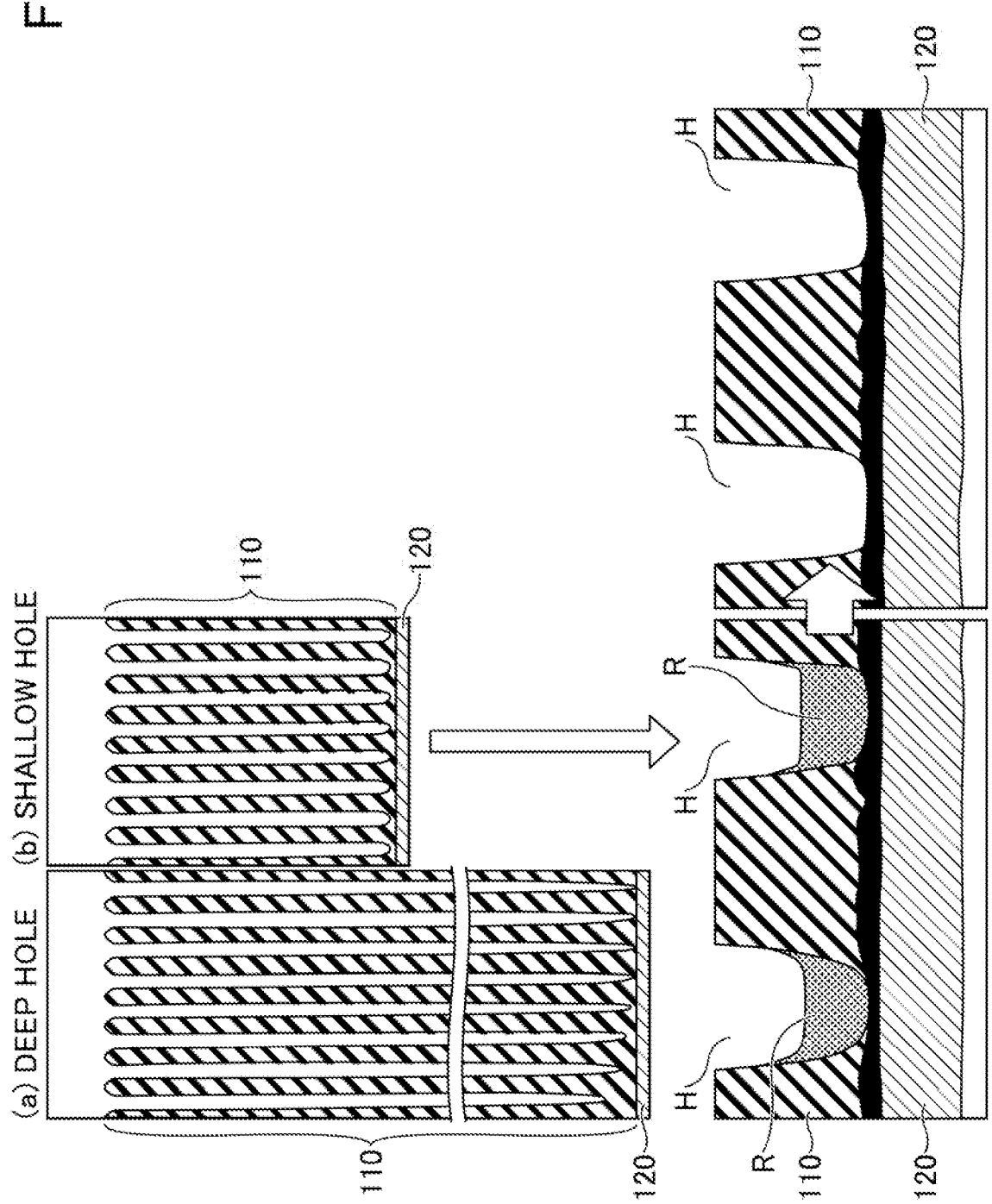
FIG. 7 is a diagram illustrating an experimental result of the etching method according to the present embodiment.

An example of an experimental result of etching performed under the process conditions of the first step to the third step according to the etching method In the present embodiment will be described with reference to FIG. 7. FIG. 7 is a diagram illustrating the example of the experimental result of the etching method according to the present embodiment.

In the present experiment, two types of etching were performed by the etching method according to the present embodiment: deep holes illustrated in a diagram (a) of FIG. 7, and shallow holes illustrated in a diagram (b) of FIG. 7. The depth of the deep holes was 10 to 20 times the depth of the shallow holes.

As a result of the experiment, referring to the lower left diagram in FIG. 7 which is an enlarged view of the bottom of the shallow holes, by-products R of polymers having a thickness of 50 nm or greater were deposited on the bottom of the shallow holes, confirming a protective effect of the underlying film 120.

The lower right diagram in FIG. 7 illustrates a state after the by-products R deposited at the bottom of the shallow holes were removed by ashing. According to this, an amount of consumption of tungsten of the underlying film 120 was 13 nm. An amount of tungsten consumed by the etching method under the process condition of the first step was 26 nm. Accordingly, it has been found that the etching method according to the present embodiment can reduce an amount of consumption of tungsten, and can etch the silicon oxide film 110 on each of the underlying films 120 with different depths while suppressing damage to the multiple underlying films 120 with different heights.

Etching Mode

With respect to the etching method according to the present embodiment described above, an example of process conditions determining whether a mode of etching performed in the first step to the third step is etching with a deposition property or etching with a removable property will be described with reference to FIG. 8. Whether the etching mode is the etching with a deposition property or the etching with a removable property depends on an amount of C that produces deposits and an amount of O that removes deposits. FIG. 8 is a diagram illustrating the relationship between the etching mode, a gas species that can be used in the etching method in accordance with the present embodiment, and a flow rate of the gas.

In the table of FIG. 8, for seven conditions (C1 to C7 of the "Condition" column), the number of C to the number of O (i.e., C/O ratio) is calculated. For example, in the condition of "C4", the $C_4F_6$ gas, $C_3F_8$ gas, CO gas, and $O_2$ gas are supplied at 30 sccm, 30 sccm, 425 sccm, and 21 sccm, respectively. In this case, the sum of C (C amount) is 30×4 ($C_4F_6$ gas)+30×3 ($C_3F_8$ gas)+425 (CO gas)=635. The sum of O is 425 (CO gas)+21×2 ($O_2$ gas)=467. Thus, under the condition of "C4", the C/O ratio is 1.36 (=635/467).

As a result of performing the above-described calculation for the above-mentioned seven conditions (C1 to C7), the C/O ratio is as illustrated in the table in FIG. 8. Also, for each of the seven conditions, the mode of the etching is indicated in the column of "Mode". "Etch" means etching with a removable property, and "Depo" means etching with a deposition property. Thus, as a mode of a process condition with the C/O ratio less than 1.3 is "Etch", the C/O ratio less than 1.3 can be used as a guide for choosing a process condition (combination of gas species and gas flow rate) that realizes etching with a removable property. Also, as a mode of a process condition having the C/O ratio equal to or greater than 1.3 is "Depo", the C/O ratio equal to or greater than 1.3 can be used as a guide for choosing a process condition (combination of gas species and gas flow rate) that realizes etching with a deposition property.

Therefore, it is preferable that the C/O ratio contained in the third gas in the third step is less than 1.3, and it is preferable that the C/O ratio contained in the second gas in the second step is not less than 1.3. This allows etching with a deposition property in the second step and allows etching with a removable property in the third step. Also, it is preferable that the C/O ratio contained in the first gas in the first step is less than 1.3.

It is also preferable that a flow rate of $O_2$ gas contained in the second gas used in the second step is less than a flow rate of $O_2$ gas contained in the third gas used in the third step. This also allows etching with a higher deposition property in the second step and allows etching with a higher removable property in the third step. However, a flow rate of $O_2$ gas contained in the second gas must be controlled so as not to cause necking.

Temperature Dependence

Figure 9:
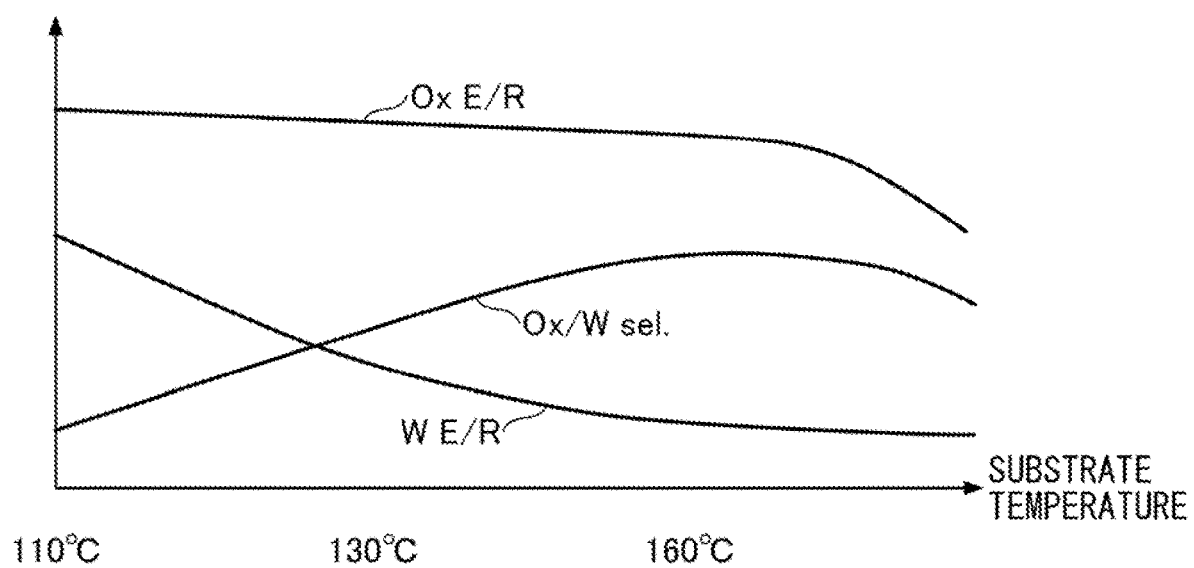
FIG. 9 is a diagram illustrating a relationship between a substrate temperature and an etch rate in the etching method according to the embodiment.

Finally, temperature dependence in etching will be described with reference to FIG. 9. FIG. 9 is a diagram illustrating the relationship between a substrate temperature and an etch rate in the etching method according to the present embodiment.

The horizontal axis of FIG. 9 indicates a substrate temperature. A curve in FIG. 9 indicated by a symbol "W E/R" represents an etch rate of the underlying film when tungsten (W) is used as the underlying film. A curve in FIG. 9 indicated by a symbol "Ox E/R" represents an etch rate of the silicon oxide film 110. A curve in FIG. 9 indicated by a symbol "Ox/W sel." represents selectivity of the silicon oxide film 110 to the underlying film of tungsten (W). The substrate temperature is approximately equal to the temperature of the electrostatic chuck 13.

The curve in FIG. 9 indicated by the symbol "W ER" indicates that the etch rate of the underlying film decreases as the substrate temperature increases. However, as the substrate temperature becomes higher, a rate at which the etch rate decreases becomes smaller. In contrast, the curve indicated by the symbol "Ox E/R" indicates that the etch rate is constant if the substrate temperature is approximately between 110° C. and 160° C., and that the etch rate decreases if the substrate temperature exceeds approximately 160° C. The curve indicated by the symbol "Ox/W sel." Indicates that the selectivity increases as the substrate temperature increases while the substrate temperature is approximately between 110° C. and 160° C., and that the selectivity decreases if the substrate temperature exceeds approximately 160° C.

As a temperature increases, ions and radicals in a plasma become difficult to adsorb. That is, as the substrate temperature becomes higher, ions and radicals in a plasma the more become difficult to adhere to the upper portion of the hole, and as the substrate temperature becomes lower, ions and radicals become likely to adhere to the upper portion of the hole.

Accordingly, it is preferable that an adsorption coefficient of the second CF-containing gas, for example, $C_3F_8$ gas, is smaller than an adsorption coefficient of the first CF-containing gas, for example, $C_4F_6$ gas. Also, the substrate temperature during the second and third steps is preferably within a range approximately between 110° C. and 160° C. This reduces the adsorption coefficient of $C_3F_8$ and $C_4F_6$ gases. This facilitates deposition of the by-products R of polymers from the bottom of the hole, and increases the Ox/W selectivity.

As described above, according to the etching method and the substrate processing apparatus 10 according to the present embodiment, etching of the silicon oxide film on each of the underlying films can be performed at different depths while preventing damage to the multiple underlying films located at different heights.

The etching method and the substrate processing apparatus according to the embodiments disclosed herein are to be considered exemplary in all respects and not limiting. The above embodiments may be modified and enhanced in various forms without departing from the appended claims and spirit thereof. Matters described in the above embodiments may take other configurations to an extent not inconsistent, and may be combined to an extent not inconsistent.

The substrate processing apparatus according to the present disclosure is applicable to any type of apparatus, such as an atomic layer deposition (ALD) type, a capacitively coupled plasma (CCP) type, an inductively coupled plasma (ICP) type, a radial line slot antenna type (RLSA), an electron cyclotron resonance plasma (ECR) type, and a helicon wave plasma (HWP) type.

What is claimed is:
1. A method comprising:
 a) preparing a substrate above which a first underlying film, a second underlying film formed at a deeper location than the first underlying film, a silicon oxide film formed on the first underlying film and the second underlying film, and a mask formed on the silicon oxide film are provided, the mask having a first opening formed above the first underlying film and a second opening formed above the second underlying film;

b) etching the silicon oxide film above the first underlying film and the second underlying film by using a first gas, thereby exposing the first underlying film;

c) etching the silicon oxide film above the second underlying film by using a second gas, while depositing deposits on the first underlying film;

d) etching the silicon oxide film above the second underlying film by using a third gas, while removing the deposits on the first underlying film; and e) repeating step c) and step d) a plurality of times.

2. The method according to claim 1, wherein
the third gas contains a first CF-containing gas and oxygen gas; and
the second gas contains a second CF-containing gas different from the first CF-containing gas, and oxygen gas.

3. The method according to claim 2, wherein a C/F ratio of the second CF-containing gas is smaller than a C/F ratio of the first CF-containing gas.

4. The method according to claim 2, wherein an adsorption coefficient of the second CF-containing gas in a predetermined temperature range is smaller than an adsorption coefficient of the first CF-containing gas in the predetermined temperature range.

5. The method according to claim 2, wherein the first CF-containing gas is $C_4F_6$, and the second CF-containing gas is $C_3F_8$.

6. The method according to claim 2, wherein a C/O ratio of the third gas is smaller than 1.3, and a C/O ratio of the second gas is equal to or greater than 1.3.

7. The method according to claim 2, wherein a flow rate of the oxygen gas contained in the second gas is less than a flow rate of the oxygen gas contained in the third gas.

8. The method according to claim 4, wherein the predetermined temperature range is between 110° C. and 160° C.

9. The method according to claim 1, wherein the first underlying film and the second underlying film are formed of tungsten.

10. The method according to claim 1, wherein the first underlying film and the second underlying film are formed of silicon.

11. The method according to claim 1, wherein a time for etching the silicon oxide film by using the second gas is shorter than a time for etching the silicon oxide film by using the third gas.

12. The method according to claim 1, wherein step e) is performed before the second underlying film is exposed.

13. The method according to claim 12, wherein
a third underlying film is further formed above the substrate, at a deeper location than the second underlying film;
the silicon oxide film is formed on the third underlying film; and
the method further includes
f) etching the silicon oxide film above the third underlying film by using the second gas, while depositing the deposits on the first underlying film and the second underlying film;
g) etching the silicon oxide film above the third underlying film by using the third gas, while removing the deposits on the first underlying film and the second underlying film; and
h) repeating step f) and step g) a plurality of times, after the second underlying film is exposed and before the third underlying film is exposed.

14. The method according to claim 13, wherein
the third gas contains a first CF-containing gas and oxygen gas; and
the second gas contains a second CF-containing gas different from the first CF-containing gas, and oxygen gas.

15. The method according to claim 14, wherein a C/F ratio of the second CF-containing gas is smaller than a C/F ratio of the first CF-containing gas.

16. The method according to claim 15, wherein the first CF-containing gas is $C_4F_6$, and the second CF-containing gas is $C_3F_8$.

17. The method according to claim 16, wherein a flow rate of the oxygen gas contained in the second gas is less than a flow rate of the oxygen gas contained in the third gas.

18. The method according to claim 17, wherein a C/O ratio of the third gas is smaller than 1.3, and a C/O ratio of the second gas is equal to or greater than 1.3.

19. The method according to claim 18, wherein a time for etching the silicon oxide film by using the second gas is shorter than a time for etching the silicon oxide film by using the third gas.

* * * * *